Figure 1:
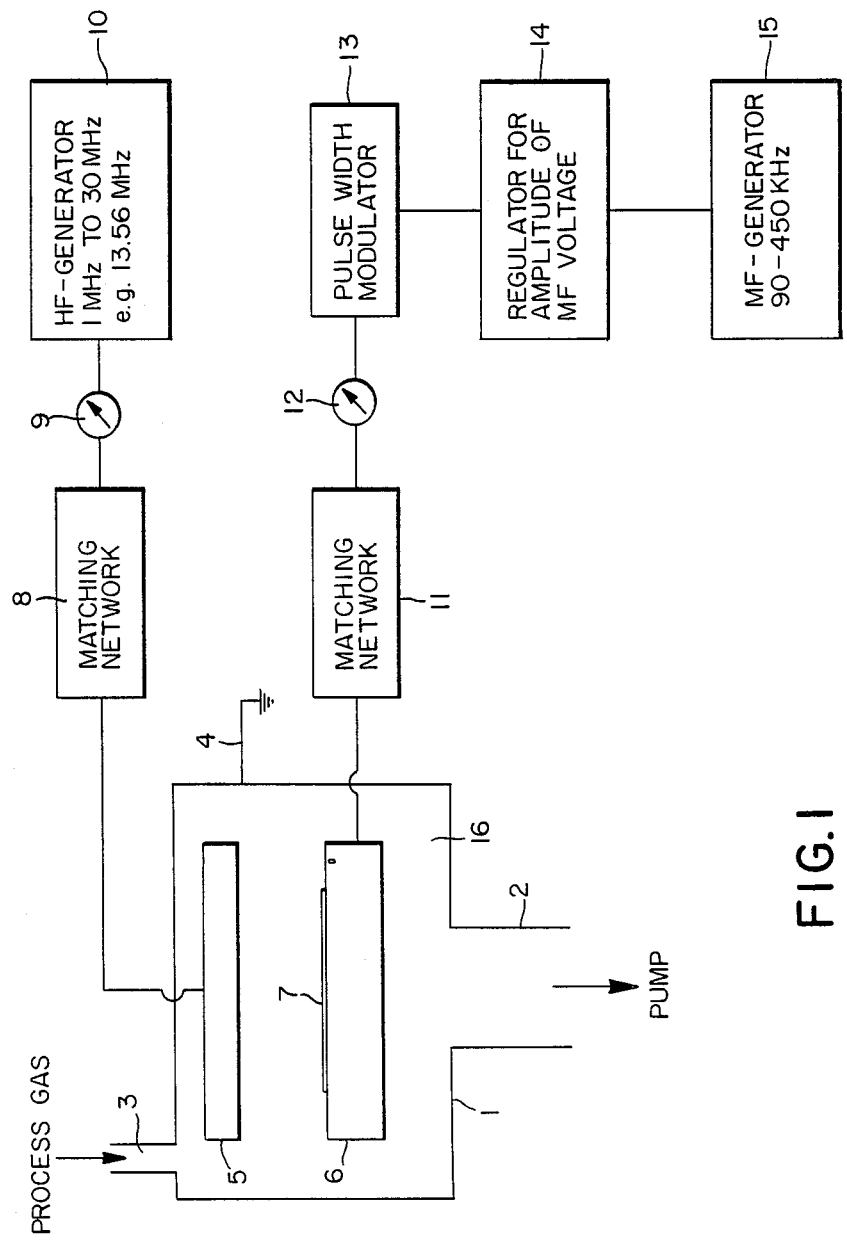

United States Patent [19]

Grünwald

[11] Patent Number: 4,863,549
[45] Date of Patent: Sep. 5, 1989

[54] APPARATUS FOR COATING OR ETCHING BY MEANS OF A PLASMA

[75] Inventor: Heinrich Grünwald, Hanau, Fed. Rep. of Germany

[73] Assignee: Leybold Aktiengesellschaft, Hanau, Fed. Rep. of Germany

[21] Appl. No.: 214,450

[22] Filed: Jul. 1, 1988

[30] Foreign Application Priority Data

Oct. 1, 1987 [DE] Fed. Rep. of Germany ....... 3733135

[51] Int. Cl.$^4$ .................. H01L 21/306; B44C 1/22; C03C 15/00; C03C 25/06
[52] U.S. Cl. ................. 156/345; 118/620; 118/728; 118/50.1; 156/643; 156/646; 156/657; 156/662; 204/192.37; 204/298; 427/38
[58] Field of Search ............ 118/620, 621, 625, 723, 118/50.1, 728; 156/345, 643, 646, 657, 659.1, 662; 427/38, 39; 204/192.32, 192.35, 192.37, 298, 192.1, 192.12, 192.23, 192.25

[56] References Cited

U.S. PATENT DOCUMENTS

| 4,464,223 | 8/1984 | Gorin | 156/345 X |
| 4,500,563 | 2/1985 | Ellenberger et al. | 156/345 X |
| 4,585,516 | 4/1986 | Corn et al. | 156/345 X |
| 4,617,079 | 10/1986 | Tracy et al. | 156/345 |

OTHER PUBLICATIONS

"Multi-Electrode Plasma Etching," John Zajac et al., Tegal Process Review, May 1984, vol. 1, No. 1.
"Advances in Dry Etching Processes—A Review," S. J. Fonash, Solid State Technology, Jan. 1985.

Primary Examiner—William A. Powell
Attorney, Agent, or Firm—Koda and Androlia

[57] ABSTRACT

The invention concerns apparatus for coating or etching by means of a plasma. Herein a first electrode (5) is connected to a high frequency voltage which produces plasma from a gas. A second electrode (6), on which the substrate (7) to be coated or etched is disposed, is connected to a medium frequency voltage which accelerates the ions of the plasma to the substrate (7). According to the invention, this medium frequency voltage consists of unipolar pulses that have the same amplitude for a predeterminable time interval. The number of ions impinging on the substrate (7) is thereby decoupled from the amplitude of the applied medium frequency voltage. It is determined solely by the frequency or width of these pulses.

15 Claims, 1 Drawing Sheet

APPARATUS FOR COATING OR ETCHING BY MEANS OF A PLASMA

The invention concerns apparatus for coating or etching by means of a plasma, with a first electrode in electrical connection with the substrate to be coated or etched, as well as a second electrode arranged above the first electrode, the two electrodes being disposed within a process chamber serving as a third electrode, and wherein the first electrode is connected with a medium frequency generator that controls the current and the ion bombardment of the substrate, while the second electrode is connected with a high frequency generator that controls the extent of dissociation and the formation of radical species.

In addition to wet processes, dry processes for coating or etching substrates are also used to an increased extent. While in the wet processes a liquid etchant or depositing substrate is applied to defined sites of the substrate, in the dry processes gases are used as ions to knock out parts of the substrate or to deposit on this substrate under formation of chemical compounds. The advantages of the dry processes consist in lower costs in chemicals, lower environmental pollution and a high degree of automation.

Numerous dry processes are known already, which have as a common factor the utilisation of a gas plsma and which differ from each other chiefly in differing gases, gas pressures and electrode arrangements (S. J. Fonash: Advances in Dry Etching Processes - A review, Solid State Technology, Jan. 1985, pages 150–158). Among these processes the so-called triode process plays an ever greater role in practice.

In the triode process separate high frequency voltages are applied to a substrate reactor (Fonash, ibid., page 52, FIG. 2; Tegal Process Review, May 1984, Vo. 1, No. 1). The third electrode is constituted by a housing, usually grounded, surrounding the other two electrodes. The high frequency voltage at one electrode is, for example, 13.56 MHz so that the gas is ionised thereby. However, at this high frequency due to their inertia the ions cannot reach the substrate. Hence the voltage of the substrate electrode is of especial significance. When its frequency is selected to be clearly below 1 MHz, the ions of the plasma are accelerated by this voltage through the dark space through the substrate electrode to the substrate. The decisive factor for the kinetic energy of these ions in this case is, on the one hand, the potential difference between the volume of the plasma, i.e. one point of the space charge and the substrate electrode; and on the other hand, the peak output voltage of the high or medium frequency/voltage at the substrate electrode. For the mentioned potential difference one is concerned with a direct voltage which forms to some extent automatically on the basis of the space charge conditions that are present. The medium frequency voltage at the substrate electrode is adjustable, in contrast thereto, and can thus control the ion current.

A disadvantage of the hitherto known triode arrangements consists in that the peak output voltage cannot be adjusted independently of the output because of the generators employed. This means that each time the peak output voltage is altered the ion current is automatically altered with it. However, in many cases this is undesirable because at high voltages damage to the substrate may arise.

The task to be solved by the invention is therefore to control the potential difference between the volume of the plasma and the substrate independently of the electrical power supplied.

This task is solved by the measure that the current of the ion bombardment is controllable even for a fixed predetermined voltage of the medium frequency generator.

The advantage achieved by means of the invention consists particularly in that the supplied electric power which determines the extent of excitation, fragmentation and ionisation of the plasma and medium frequency voltage relevant for the energy of the ions impinging on the substrate may be mutually independently set to their respective optimal values. By virtue of the fact that the electrode other than the substrate electrode is fed with a high frequency voltage of preferably 13.56 MHz, while the substrate electrode is fed with a high frequency voltage of preferably 90 to 450 KHz which contains no positive particles and may be steplessly regulated from 20 V to 200 V, it becomes posible to regulate the electrical power fed in by the medium frequency generator without changing the magnitude of the medium voltage, i.e. the peak output voltage. The acceleration imparted to the ions within a predetermined time interval is thus always constant. Nevertheless, the number of ion impinging on the subtrate may be controlled by intermittently applying the medium frequency voltage to the substrate electrode. In this way the ions are accelerated towards the substrate somewhat in the form of packets or bunches. Thus the peak output voltage of the medium frequency voltage may be held to a low value so that no damage to the substrate arises.

A preferred embodiment of the invention is illustrated in the drawing and is described in detail in what follows.

The single FIGURE shows a schematic lay-out of the invention.

There is here provided a process chamber 1 which has a gas outlet pipe 2 and a gas inlet pipe 3. The process chamber 1 consists of a metallic housing grounded via a conductor 4. In the process chamber 1 itself an upper electrode 5 is disposed oppositely to a lower electrode 6. A substrate 7 to be etched or coated is electrically connected to this lower electrode 6. The upper electrode 5 is connected via a matching network 8 and a power meter 9 with a high frequency generator 10 the frequency of which may be freely selected e.g. between 1 MHz and 30 MHz. The initially neutral gas is dissociated into ions and electrons by means of the voltage of the high frequency generator. The lower electrode 6 is connected via a matching network 11 and a power meter 12 to a pulse width modulator 13 controlled by a regulator 14 for the high frequency voltage amplitude. In its turn, this regulator 14 is connected to a medium frequency generator 15 operated at a frequency of, preferably, 90 to 450 KHz.

The mode of operation of the arrangement according to the FIGURE is described in the following.

The process chamber 1 is first evacuated with the aid of a nonillustrated pump assembly connected to the gas outlet pipe 2 to a basic pressure of $10^{-4}$ Pa. Then a process gas, or a process gas mixture consisting for instance of $SF_6$ and $Cl_2$ in a mixture of ratio of 1:1, and with a throughflow rate of e.g. 100 $cm^3$/bar.min, is continuously supplied via the gas inlet 3 into the interior of the process chamber 1. By suitably regulating the suction output of the pump assembly, a predetermined pressure of e.g. 15 Pa is set. The voltage of the high frequency generator 10 is now set to 13.56 MHz and to a power of 400 W, and applied via the power meter 9 and the matching network 8 to the upper electrode 5. Simultaneously, with the aid of the medium frequency generator 15 a medium frequency voltage of 150 KHz is produced. The amplitude of this medium frequency voltage is set by the regulator 14 to a predetermined value of about 30 Volts, while the power of the medium frequency generator 15 is adjusted to 100 W with the aid of the pulse width modulator 13. A plasma is produced thereby between the lower electrode 6 and the upper electrode 5, under the effect of which an upper thin layer of the substrate 7 is etched through at a high rate without attacking the substrate 7 itself to any extent worth mentioning. The upper thin layer concerned is preferably a polysilicon layer, while the layer below it is in turn made up of several layers. The lowermost layer is the actual substrate made of silicon, on which is disposed a layer of thermic $SiO_2$ with thickness of 0.1 $\mu$m. Above it is a 0.4 $\mu$m thick layer of polysilicon which is covered by a 1 $\mu$m thick layer of photoresist. The upper polysilicon layer is etched through anisotropically, and moreover at an etching rate of 1 $\mu$m/min.

By virtue of the fact that the medium frequency voltage is applied to the substrate electrode 6 in the form of unipolar pulses which have always the same amplitude within a predeterminable time interval, the ions are all equally accelerated, i.e. impinge on the substrate at the same velocity. The number of impinging ions may nevertheless be varied by applying the pulses for a greater or lesser duration. Although the preferred embodiment has been described with reference to pulse width modulation, all other kinds of modulation are suitable for realizing the invention which assure a constant amplitude for all pulses within a given time interval.

Self-evidently it is also possible with the invention to vary the amplitude of the pulses, if desired. The same possibilities are thereby afforded by the invention as by conventional processes, but wherein additionally a decoupling of the applied voltage from the ion current is achievable.

I claim:

1. Apparatus for plasma coating or etching, with a first electrode in electrical connection with the substrate to be coated or etched, as well as a second electrode arranged above the first electrode, the two electrodes being disposed within a process chamber serving as a third electrode, and wherein the first electrode is connected with a medium frequency generator that controls the current and the ion bombardment of the substrate, while the second electrode is connected with a high frequency generator that controls the extent of dissociation and the formation of radical species, characterised in that the current of the ionic bombardment is also controllable with a fixedly predetermined voltage of the medium frequency generator (15).

2. Apparatus according to claim 1, characterised in that the voltage of the medium frequency generator (15) is applied intermittently to the first electrode.

3. Apparatus according to claim 1 chracterised in that the voltage is applied to the first electrode in a pulsed manner, wherein the pulses have the same amplitude and the same width but different spacings from each other (pulse phase modulation).

4. Apparatus according to claim 1 characterised in that the voltage is applied to the first electrode in a pulsed manner, wherein the pulses have the same amplitude but different widths (pulse width modulation).

5. Apparatus according to claim 1 characterised in that the voltage is applied to the first electrode in a pulsed manner, wherein the pulses have the same amplitude and the same width while forming groups separated from each other, the pulses being equidistant from each other within a group (pulse code modulation).

6. Apparatus according to claim 1, characterised in that the frequency of the high frequency generator (10) is adjustable between 1 MHz and 30 MHz.

7. Apparatus according to claim 1, characteristed in that the frequency of the medium frequency generator (15) is adjustable between 90 KHz and 450 KHz.

8. Apparatus according to claim 7, characterised in that a regulator (14) is provided to set the amplitude of the medium frequency voltage to a predetermined value.

9. Apparatus according to claim 1, 2, 3, 4, 5, 6, 7 or 8, characterised in that the voltage pulses of the medium frequency generator (15) are unipolar.

10. Apparatus according to claim 1, 2, 3, 4, 5, 6, 7 or 8, characterised in that the pulses of equal amplitude represent the amplitude of the medium frequency voltage through their width or their spacing or their number within a group.

11. Apparatus according to claim 4, characterised in that a pulse width modulator (13) is provided which delivers unipolar voltage pulses the width of which is proportional to the amplitude of the medium frequency voltage coming from the regulator (14).

12. Apparatus according to claim 1, characterised in that a matching member (11) is provided between the pulse width modulator (13) and the electrode (6) on which the substrate (7) is disposed.

13. Apparatus according to claim 6, characterised in that the frequency of the high frequency generator (10) is fixed at 13.56 MHz.

14. Apparatus according to claim 1, characterised in that the pulses have negative polarity.

15. Apparatus according to claim 9, characterised in that the pulses of equal amplitude represent the amplitude of the medium frequency voltage through their width or their spacing or their number within a group.

* * * * *